(12) United States Patent
Do et al.

(10) Patent No.: US 9,478,448 B2
(45) Date of Patent: Oct. 25, 2016

(54) THERMAL TREATMENT SYSTEM AND METHOD OF PERFORMING THERMAL TREATMENT AND METHOD OF MANUFACTURING CIGS SOLAR CELL USING THE SAME

(71) Applicant: AVACO CO., LTD., Daegu (KR)

(72) Inventors: Jin Yeong Do, Daegu (KR); Hee Chul Yang, Daegu (KR); Suk Jin Kim, Daegu (KR); Jong Youb Jung, Daegu (KR); Bong Cheol Kim, Daegu (KR); Seok Jin Lee, Daegu (KR); Ki Young Jung, Daegu (KR); Jin U Seo, Daegu (KR); Sung Hwan Paeng, Daegu (KR); Deok Woo Han, Daegu (KR); Jae Gun Hwang, Daegu (KR); Min Hwan Kang, Daegu (KR); In Ha Lee, Daegu (KR)

(73) Assignee: Avaco Co., Ltd., Daegu (KR)

( * ) Notice: Subject to any disclaimer, the term of this patent is extended or adjusted under 35 U.S.C. 154(b) by 0 days.

(21) Appl. No.: 14/655,664

(22) PCT Filed: Apr. 1, 2014

(86) PCT No.: PCT/KR2014/002763
§ 371 (c)(1),
(2) Date: Jun. 25, 2015

(87) PCT Pub. No.: WO2014/163366
PCT Pub. Date: Oct. 9, 2014

(65) Prior Publication Data
US 2015/0340256 A1  Nov. 26, 2015

(30) Foreign Application Priority Data
Apr. 5, 2013 (KR) .................. 10-2013-0037558

(51) Int. Cl.
*H01L 21/67* (2006.01)
*H01L 31/18* (2006.01)
(Continued)

(52) U.S. Cl.
CPC ... *H01L 21/67109* (2013.01); *H01L 21/67248* (2013.01); *H01L 21/67739* (2013.01);
(Continued)

(58) Field of Classification Search
CPC .................. H01L 21/67109; H01L 21/67248; H01L 23/467
See application file for complete search history.

(56) References Cited

U.S. PATENT DOCUMENTS

| 8,998,606 B2 | 4/2015 | Alexander et al. |
| 2004/0144316 A1* | 7/2004 | Lee ........................ C23C 14/566 |
| | | 118/719 |

(Continued)

FOREIGN PATENT DOCUMENTS

| CM | 103021823 A | 4/2013 |
| CN | 101118933 A | 2/2008 |

(Continued)

OTHER PUBLICATIONS

Kyung Ho Lee; "CIGS Layer Forming Apparatus Capable of Automatically Operating a Door to Open and Close a Chamber"; Abstract of KR1020130020459 A; Feb. 27, 2013; http://kpa.kipris.or.kr.

(Continued)

*Primary Examiner* — Karen Kusumakar
(74) *Attorney, Agent, or Firm* — Andrew D. Fortney; Central California IP Group, P.C.

(57) ABSTRACT

Disclosed is a thermal treatment system which enables a uniform temperature distribution and a uniform concentration distribution of reaction gas in an entire reaction space for a thermal treatment process, a method of performing a thermal treatment, and a method of manufacturing a CIGS solar cell using the same, wherein the thermal treatment system may include a reaction chamber with a reaction space, an external chamber surrounding the reaction chamber, a door chamber provided to open or close the reaction space of the reaction chamber, and an air flow adjusting apparatus for circulation of an air flow inside the reaction space of the reaction chamber, wherein the air flow adjusting apparatus includes a driving axis, an air flow suction unit connected with the driving axis, and an air flow discharging unit connected with the air flow suction unit.

8 Claims, 7 Drawing Sheets

(51) Int. Cl.
*H01L 21/677* (2006.01)
*H01L 31/032* (2006.01)

(52) U.S. Cl.
CPC ........... *H01L31/0322* (2013.01); *H01L 31/18* (2013.01); *H01L 31/1864* (2013.01); *Y02E 10/541* (2013.01)

(56) References Cited

U.S. PATENT DOCUMENTS

| | | | | |
|---|---|---|---|---|
| 2004/0257766 | A1* | 12/2004 | Rasmussen | H05K 7/20572 361/689 |
| 2006/0164809 | A1* | 7/2006 | Yu | F28D 15/0233 361/704 |
| 2008/0216895 | A1 | 9/2008 | Aoki et al. | |
| 2011/0132755 | A1 | 6/2011 | Kim et al. | |
| 2012/0009728 | A1 | 1/2012 | Li | |
| 2012/0237885 | A1 | 9/2012 | Alexander et al. | |
| 2012/0264072 | A1 | 10/2012 | Tandon | |

FOREIGN PATENT DOCUMENTS

| | | | |
|---|---|---|---|
| CN | 201330261 Y | | 10/2009 |
| KR | 1020020088620 A | | 11/2002 |
| KR | 1020020095362 A | | 12/2002 |
| KR | 1020130020459 | * | 8/2011 |
| KR | 10-1157201 B1 | | 6/2012 |
| KR | 1020130020459 A | | 2/2013 |
| TW | 201023376 A | | 6/2010 |
| TW | 201304175 A | | 1/2013 |

OTHER PUBLICATIONS

Kyung Ho Lee et al.; "Apparatus for Forming a CIGS Layer"; Bibliographic Data of KR20110121443 (A); Nov. 7, 2011; http://worldwide.espacenet.com.

Yo Han Ahn et al.; "Air Current Generating Apparatus Installed in Semiconductor Fabricating Area", Abstract of KR1020020095362 A; Dec. 26, 2002; http://kpa.kipris.or.kr.

Jong Mun Choi et al.; "Annealing Apparatus Having Vacuum Heat Insulating Material"; Abstract of KR1020020088620 A; Nov. 29, 2002; http://kpa.kipris.or.kr.

International Search Report dated Jul. 28, 2014 for International Application No. PCT/KR2014/002763; 3 pgs.

Office Action with partial English Translation dated Mar. 4, 2016; Taiwanese Patent Application No. 103112624; 8 pgs.; Korean Intellectual Property Office, Republic of Korea.

Office Action with partial English Translation dated Mar. 25, 2016; Chinese Patent Application No. 201480003860.9; 11 pgs.; The State Intellectual Property Office of the P.R.C., People's Republic of China.

Li Hesheng et al.; "Non-vacuum Stepping Pass-type Rapid Selenizing Device and Selenizing Method Implemented by Same"; Bibliographic Data of CN103021823 (A); Apr. 3, 2013; http://worldwide.espacenet.com.

Bai-Rong Zhang et al.; "Selenization Sintering Device for CIGS Film Layer"; Bibliographic Data of TW201304175 (A); Jan. 16, 2013; http://worldwide.espacenet.com.

Duan-Long Zhuang; "Light Absorption Layer of CIGS Solar Cell and Manufacturing Method Thereof"; Bibliographic Data of TW201023376 (A); Jun. 16, 2010; http://worldwide.espacenet.com.

Li Yuxuan et al.; "Strong Convection Atmosphere Protecting Spheroidizing Annealing Oven"; Bibliographic Data of CN201330261 (A); Oct. 21, 2009; http://worldwide.espacenet.com.

Aoki Satoshi et al.; "Chalcopyrite Solar Cell and Manufacturing Method Thereof"; Bibliographic Data of CN101118933 (A); Feb. 6, 2008; http://worldwide.espacenet.com.

* cited by examiner

THERMAL TREATMENT SYSTEM AND METHOD OF PERFORMING THERMAL TREATMENT AND METHOD OF MANUFACTURING CIGS SOLAR CELL USING THE SAME

TECHNICAL FIELD

The present invention relates to a CIGS solar cell, and more particularly, to a thermal treatment system for forming a light-absorbing layer, and a method of performing a thermal treatment.

BACKGROUND ART

A solar cell converts light energy to electrical energy by the use of semiconductor properties.

If briefly explaining structure and principle of the solar cell, the solar cell has a PN junction structure by junction of positive(P) type semiconductor and negative(N) type semiconductor. When solar light is incident into the solar cell, hole and electron are generated in the solar cell owing to energy of the incident solar light. Due to an electric field formed in the PN junction, the hole drifts to the P type semiconductor, and the electron drifts to the N type semiconductor, to thereby generate an electric potential.

The solar cell may be classified into a bulk solar cell and a thin film solar cell.

The bulk solar cell may be manufactured by using a substrate of semiconductor material such as silicon, and the thin film solar cell may be manufactured by forming a thin-film semiconductor layer on a glass substrate.

The thin film solar cell may be classified into Si thin film solar cell and compound thin film solar cell on the basis of material for a light-absorbing layer. Also, the compound thin film solar cell may be classified into III-V solar cell and CIGS solar cell.

The CIGS solar cell uses a light-absorbing layer which is formed by a compound of copper (Cu), indium (In), gallium (Ga) and selenium (Se).

Hereinafter, a related art CIGS solar cell will be described with reference to the accompanying drawings.

Figure 1:
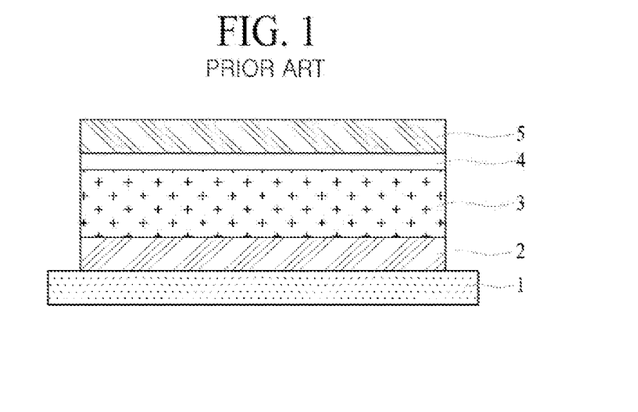
FIG. 1 is cross sectional view illustrating a related art CIGS solar cell.

FIG. 1 is a cross sectional view illustrating the related art CIGS solar cell.

As shown in FIG. 1, the related art CIGS solar cell may include a substrate 1, a rear electrode 2, a light-absorbing layer 3, a buffer layer 4 and a front electrode 5.

The rear electrode 2 is formed on the substrate 1. Generally, the rear electrode 2 is made of molybdenum (Mo). The light-absorbing layer 3 is formed on the rear electrode 2, and the light-absorbing layer 3 is made of a compound of copper (Cu), indium (In), gallium (Ga) and selenium (Se). The buffer layer 4 is formed on the light-absorbing layer 3. Generally, the buffer layer 4 is made of cadmium sulfide (CdS). The front electrode 5 is formed on the buffer layer 4, and the front electrode 5 is made of transparent conductive oxide (TCO).

The related art CIGS solar cell may be manufactured by forming the rear electrode 2 of molybdenum (Mo) on the substrate 1, forming a multi-layered precursor layer including a first precursor layer of copper-gallium (CuGa) and a second precursor layer of indium (In) on the rear electrode 2, forming the light-absorbing layer 3 of CIGS by a thermal treatment under Se atmosphere, forming the buffer layer 4 of cadmium sulfide (CdS) on the light-absorbing layer 3, and forming the front electrode 5 of transparent conductive oxide (TCO) on the buffer layer 4.

A point of the CIGS solar cell is the light-absorbing layer 3 of CIGS. In order to improve efficiency and yield of solar cell, it is necessary to find an optimal method for forming the light-absorbing layer 3. Especially, as mentioned above, the light-absorbing layer 3 is formed by depositing the precursor layer, and performing the high-temperature thermal treatment thereto. Thus, it is very important to improve efficiency of the thermal treatment.

However, a related art system for the thermal treatment has limitations on the thermal treatment for the precursor layer.

Especially, there has been proposed Korean Patent Publication No. P2011-0121443 which relates to a thermal treatment system for a large-sized substrate. However, a temperature distribution in an entire reaction space is not uniform, and a concentration distribution of reaction gas is not uniform for a thermal treatment process.

DISCLOSURE

Technical Problem

Therefore, the present invention has been made in view of the above problems, and it is an object of the present invention to provide a thermal treatment system which enables a uniform temperature distribution and a uniform concentration distribution of reaction gas in an entire reaction space for a thermal treatment process, and a method of manufacturing a CIGS solar cell using the same.

Technical Solution

To achieve these objects and other advantages and in accordance with the purpose of the invention, as embodied and broadly described herein, there is provided a thermal treatment system that may include a reaction chamber with a reaction space; an external chamber surrounding the reaction chamber, the external chamber provided at a predetermined interval from the reaction chamber; a door chamber provided to open or close the reaction space of the reaction chamber; and an air flow adjusting apparatus for circulation of an flow inside the reaction space of the reaction chamber, wherein the air flow adjusting apparatus includes a driving axis, an air flow suction unit connected with the driving axis, and an air flow discharging unit connected with the air flow suction unit, wherein air flow inside the reaction space is sucked to the air flow suction unit by an operation of the driving axis, and is then discharged through the air flow discharging unit so as to circulate air flow inside the reaction space.

In another aspect of an embodiment of the present invention, there is provided a method of performing a thermal treatment that may include replacing air inside a reaction chamber with an inert gas; gradually raising a temperature inside the reaction chamber, and supplying a reaction gas to the inside of the reaction chamber; maintaining the temperature inside the reaction chamber, and performing a reaction on a precursor layer of a substrate placed onto a boat inside the reaction chamber; and cooling the inside of the reaction chamber, wherein air flow inside the reaction space is circulated through an air flow adjusting apparatus including an air flow suction unit and an air flow discharging unit provided in the reaction chamber during the process of supplying the reaction gas to the inside of the reaction chamber, wherein the process of circulating the air flow inside the reaction space includes steps of moving the air flow in a swirl structure along the periphery of the boat toward the rear of the reaction chamber by the air flow discharging unit; and moving the air, which is moved toward the rear of the reaction chamber, toward the air flow adjusting apparatus along the inside of the boat by the air flow suction unit.

In another aspect of an embodiment of the present invention, there is provided a method of manufacturing a CIGS solar cell that may include forming a rear electrode on a substrate; forming a precursor layer on the rear electrode; forming a light-absorbing layer by performing a thermal treatment for the precursor layer; forming a buffer layer on the light-absorbing layer; and forming a front electrode on the buffer layer, wherein the thermal treatment for the precursor layer comprises: replacing air inside a reaction chamber with an inert gas; gradually raising a temperature inside the reaction chamber, and supplying a reaction gas to the inside of the reaction chamber; maintaining the temperature inside the reaction chamber, and performing a reaction on a precursor layer of a substrate placed onto a boat inside the reaction chamber; and cooling the inside of the reaction chamber, wherein air flow inside the reaction space is circulated through an air flow adjusting apparatus including an air flow suction unit and an air flow discharging unit provided in the reaction chamber during the process of supplying the reaction gas to the inside of the reaction chamber, wherein the process of circulating the air flow inside the reaction space includes steps of moving the air flow in a swirl structure along the periphery of the boat toward the rear of the reaction chamber by the air flow discharging unit; and moving the air, which is moved toward the rear of the reaction chamber, toward the air flow adjusting apparatus along the inside of the boat by the air flow suction unit.

Advantageous Effects

According to the present invention, the air flow is circulated in the reaction space of the reaction chamber by operating the air flow adjusting apparatus so that it is possible to realize the uniform temperature distribution and the uniform concentration distribution of reaction gas in the entire reaction space.

BEST MODE

Reference will now be made in detail to the preferred embodiments of the present invention, examples of which are illustrated in the accompanying drawings.

Figure 2:
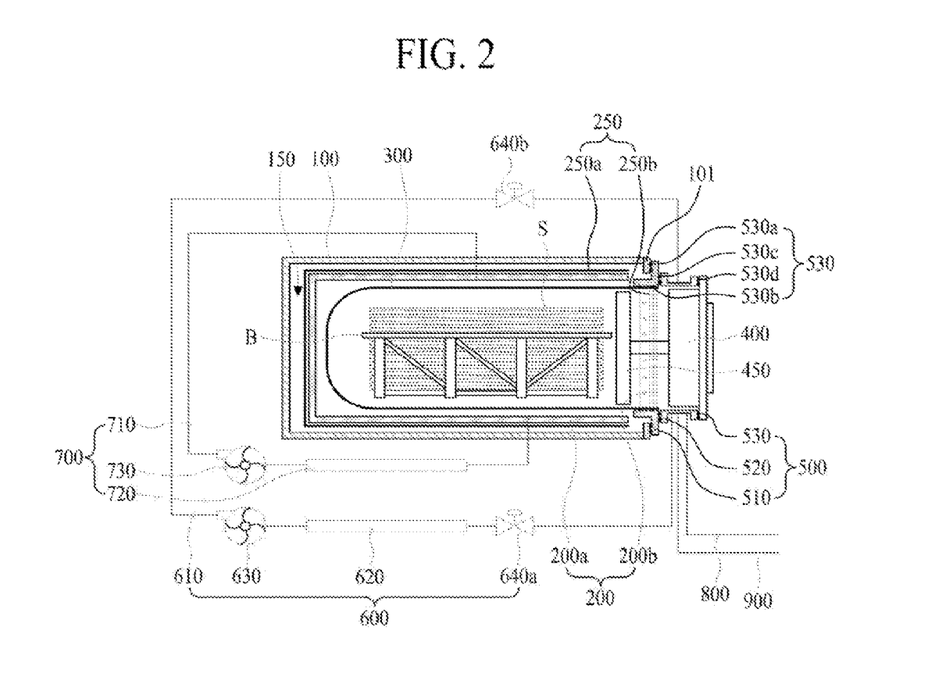
FIG. 2 is a cross sectional view illustrating a thermal treatment system according to one embodiment of the present invention.

FIG. 2 is a cross sectional view illustrating a thermal treatment system according to one embodiment of the present invention.

As shown in FIG. 2, the thermal treatment system according to one embodiment of the present invention may include an external chamber 100, a heater module 200, an insulating member 250, a reaction chamber 300, a door chamber 400, an air flow adjusting apparatus 450, a sealing member 500, an internal cooling system 600, an external cooling system 700, a gas exhausting unit 800, and a gas supplying unit 900.

The external chamber 100, which forms an external structure of the thermal treatment system, surrounds the reaction chamber 300. In more detail, the external chamber 100 surrounds the reaction chamber 300 under the circumstances that the external chamber 100 is provided at a predetermined interval from the reaction chamber 300, whereby a predetermined buffer space 150 is prepared between the external chamber 100 and the reaction chamber 300.

The heater module 200 supplies heat to the reaction chamber 300. The heater module 200 may include a first heater module 200a and a second heater module 200b.

The first heater module 200a is formed in the buffer space 150 prepared between the external chamber 100 and the reaction chamber 300. The second heater module 200b is formed in the front of the door chamber 400 which faces a reaction space of the reaction chamber 300.

The first heater module 200a formed in a relatively large area may include a plurality of heaters arranged at different positions in the periphery of the reaction chamber 300. In this case, it is possible to maintain a uniform temperature in the entire area inside the reaction chamber 300 by independently controlling a temperature in each of the plurality of heaters.

The insulating member 250 transfers heat generated in the heater module 200 to the reaction chamber 300 without being discharged to the outside. The insulating member 250 may include a first insulating member 250a and a second insulating member 250b.

The first insulating member 250a prevents heat generated in the first heater module 200a from being transferred to the external chamber 100, wherein the first insulating member 250a is provided between the first heater module 200a and the external chamber 100. The first insulating member 250a may be formed as one body with the first heater module 200a.

The second insulating member 250b prevents heat generated in the second heater module 200b from being transferred to the door chamber 400, wherein the second insulating member 250b is provided between the second heater module 200b and the door chamber 400. The second insulating member 250b may be formed as one body with the second heater module 200b.

The reaction chamber 300 provides the reaction space for performing a thermal treatment to a plurality of substrates (S) which are loaded onto a boat (B). The reaction chamber 300 may be formed of a material of good corrosion resistance, that is, a material enduring high corrosive reaction gas, for example, quartz, corrosion resistant metal or nonmetallic material.

The door chamber 400 is provided to open or close the reaction space of the reaction chamber 300. The door chamber 400 is connected with a transferring device. Thus, the reaction space of the reaction chamber 300 is opened or closed by an operation of the transferring device. In more detail, the transferring device may include a front-and-rear side transferring device which makes the door chamber 400 be adjacent to or apart from the reaction chamber 300, and a left-and-right side transferring device which transfers the door chamber 400 from a position facing the reaction space of the reaction chamber 300 to a position not facing the reaction space of the reaction chamber 300, but not limited to this structure. The transferring device may include various kinds of transferring devices generally known to those in the art.

The air flow adjusting apparatus 450 is provided to face the reaction space of the reaction chamber 300, wherein the air flow adjusting apparatus 450 adjusts an air flow of the reaction space. In more detail, the air flow adjusting apparatus 450 is provided in the front of the door chamber 400. Especially, the air flow adjusting apparatus 450 may be provided in the front of the second heater module 200b, and be fixed to the front of the door chamber 400, but not necessarily. The air flow adjusting apparatus 450 may be provided in the opposite side of the door chamber 400, that is, in the rear of the reaction chamber 300.

The air flow adjusting apparatus 450 circulates the air flow inside the reaction space of the reaction chamber 300, to thereby realize uniform temperature distribution and uniform concentration of reaction gas in the entire reaction space. The air flow adjusting apparatus 450 may be formed of an air flow circulation fan. The air flow adjusting apparatus 450 may be formed of a material of good corrosion resistance, that is, a material enduring high corrosive reaction gas, for example, quartz, corrosion resistant metal or nonmetallic material.

The sealing member 500 prevents the reaction gas of the reaction chamber 300 from being discharged to the outside. Inside the reaction chamber 300, there is provided the reaction gas with high toxicity and high ignitability. If the reaction gas, which is discharged to the outside, reacts with oxygen, there is a high possibility of explosion. Accordingly, the sealing member 500 is applied to prevent the reaction gas of the reaction chamber 300 from being discharged to the outside.

The sealing member 500 may seal the space between the external chamber 100 and the reaction chamber 300, and between the reaction chamber 300 and the surrounding atmosphere. The sealing member 500 may include a flange 510, a collar 520 and an O-ring 530.

The flange 510 together with the O-ring 530 may seal the space between the external chamber 100 and the reaction chamber 300. In more detail, one end of the flange 510 is connected with a protrusion 101 protruding from an end of the external chamber 100, and the other end of the flange 510 is connected with an external wall of the reaction chamber 300. Especially, a first O-ring 530a is formed between one end of the flange 510 and the protrusion 101 protruding from an end of the external chamber 100, and a second O-ring 530b is formed between the other end of the flange 510 and the external wall of the reaction chamber 300. Thus, the space between the external chamber 100 and the reaction chamber 300 may be sealed by combination of the flange 510, the first O-ring 530a, and the second O-ring 530b.

The collar 520 together with the O-ring 530 may seal the space between the reaction chamber 300 and the surrounding atmosphere. In more detail, one end of the collar 520 is connected with the flange 510, and the other end of the collar 520 is connected with the door chamber 400. Especially, a third O-ring 530c is formed between one end of the collar 520 and the flange 510, and a fourth O-ring 530d is formed between the other end of the collar 520 and the door chamber 400. Thus, the space between the flange 510 and the door chamber 400 may be sealed by combination of the collar 520, the third O-ring 530c, and the fourth O-ring 530d, to thereby seal the space between the reaction chamber 300 and the surrounding atmosphere.

As mentioned above, the O-ring 530 may include the first O-ring 530a, the second O-ring 530b, the third O-ring 530c, and the fourth O-ring 530d. Each O-ring 530a, 530b, 530c and 530d may be formed by combining the plurality of O-rings.

The internal cooling system 600 enables to cool the inside of the reaction chamber 300 in a short time, to thereby shorten a total processing time. If the reaction is completed in the inside of the reaction chamber 300, it is necessary to unload the boat (B) with the plurality of substrates (S) placed thereonto from the reaction chamber 300. In this case, since the plurality of substrates (S) and the boat (B) have been heated to a high temperature, the inside of the reaction chamber 300 is firstly cooled, and then the boat (B) is unloaded from the reaction chamber 300. If naturally cooling the inside of the reaction chamber 300, it takes 5 to 10 hours to cool the boat (B) and the plurality of substrates (S) with high heat capacity. That is, if using the natural cooling method, a total processing time is increased so that the yield is lowered. In order to cool the inside of the reaction chamber 300 in a short time, the internal cooling system 600 is applied.

The internal cooling system 600 may include a first circulation pipe 610, a first heat exchange apparatus 620, a first circulation apparatus 630, and shut-off valves 640a and 640b.

One end of the first circulation pipe 610 is connected with the sealing member 500, and more particularly, one side of the collar 520, and the other end of the first circulation pipe 610 is connected with the other side of the collar 520. Especially, a through hole is formed at each of one side and the other side of the collar 520 connected with the first circulation pipe 610, whereby the inside of the reaction chamber 300 is communicated with the first circulation pipe 610 via the through hole. Thus, gas inside the reaction chamber 300, and more particularly, inert gas inside the reaction chamber 300 may be circulated through the first circulation pipe 610.

The first heat exchange apparatus 620 is connected with the first circulation pipe 610. Accordingly, under the circumstances that the inert gas circulated through the first circulation pipe 610 is cooled by the first heat exchange apparatus 620, the cooled inert gas is transferred to the inside of the reaction chamber 300.

The first circulation apparatus 630 is connected with the first circulation pipe 610, whereby the inert gas is circulated between the inside of the reaction chamber 300 and the first circulation pipe 610 in accordance with an operation of the first circulation apparatus 630. The first circulation apparatus 630 may be a pump or blower.

The shutoff valves 640a and 640b are connected with the first circulation pipe 610, to thereby block the circulation of reaction gas inside the reaction chamber 300. The internal cooling system 600 is operated after discharging the reaction gas which remains on completion of the reaction inside the reaction chamber 300, and supplying the inert gas to the inside of the reaction chamber 300. Thus, it is needed to block the circulation of reaction gas before the inert gas is supplied to the inside of the reaction chamber 300, whereby the shutoff valves 640a and 640b are applied. The shutoff valves 640a and 640b may include the first shutoff valve 640a formed between the collar 520 and the first heat exchange apparatus 620, and the second shutoff valve 640b formed between the collar 520 and the first circulation apparatus 630.

The external cooling system 700 together with the internal cooling system 700 may cool the inside of the reaction chamber 300 in a short time, to thereby shorten a total processing time.

If cooling both the inside of the reaction chamber 300 and the external wall of the reaction chamber 300, it is possible to realize the increase of cooling speed inside the reaction chamber 300. Thus, the external cooling system 700 is applied to cool the buffer space 150 between the reaction chamber 300 and the external chamber 100.

The external cooling system 700 may include a second circulation pipe 710, a second heat exchange apparatus 720, and a second circulation apparatus 730.

One end of the second circulation pipe 710 is connected with one side of the external chamber 100, and the other end of the second circulation pipe 710 is connected with the other side of the external chamber 100. A through hole is formed at each of one side and the other side of the external chamber 100 connected with the second circulation pipe 710, whereby the buffer space and the second circulation pipe 710 are communicated with each other via the through hole. Thus, the inert gas of the buffer space 150 may be circulated through the second circulation pipe 710.

Especially, one end and the other end of the second circulation pipe 710 may penetrate through the first insulating member 250a and the first heater module 200a via the through hole formed in the external chamber 100. Thus, the inert gas circulated through the second circulation pipe 710 is transferred to the space between the reaction chamber 300 and the first heater module 200a, which enables to efficiently cool the external wall of the reaction chamber 300.

The second heat exchange apparatus 720 is connected with the second circulation pipe 710. Thus, under the circumstances that the inert gas circulated through the second circulation pipe 710 is cooled by the second heat exchange apparatus 720, the cooled inert gas is transferred to the inside of the buffer space 150.

The second circulation apparatus 730 is connected with the second circulation pipe 710, whereby the inert gas is circulated between the buffer space 150 and the second circulation pipe 710 in accordance with an operation of the second circulation apparatus 730. The second circulation apparatus 730 may be a pump or blower.

The gas exhausting unit 800 discharges air inside of the reaction chamber 300 or reaction gas which remains on completion of the reaction inside the reaction chamber 300. The gas exhausting unit 800 is connected with the sealing member 500, and more particularly, the collar 520. Especially, the through hole is formed in the collar 520 connected with the gas exhausting unit 800, whereby the inside of the reaction chamber 300 and the gas exhausting unit 800 are communicated with each other via the through hole.

The gas supplying unit 900 supplies the inert gas or reaction gas to the inside of the reaction chamber 300. The gas supplying unit 900 is connected with the sealing member 500, and more particularly, the collar 520. Especially, the through hole is formed in the collar 520 connected with the gas supplying unit 900, whereby the inside of the reaction chamber 300 and the gas supplying unit 900 are communicated with each other via the through hole.

Each of the gas exhausting unit 800 and the gas supplying unit 900 may be provided with an additional pipe connected with the collar 520. However, the gas exhausting unit 800 and the gas supplying unit 900 may be provided in a structure being diverged from one pipe connected with the collar 520.

Figure 3:
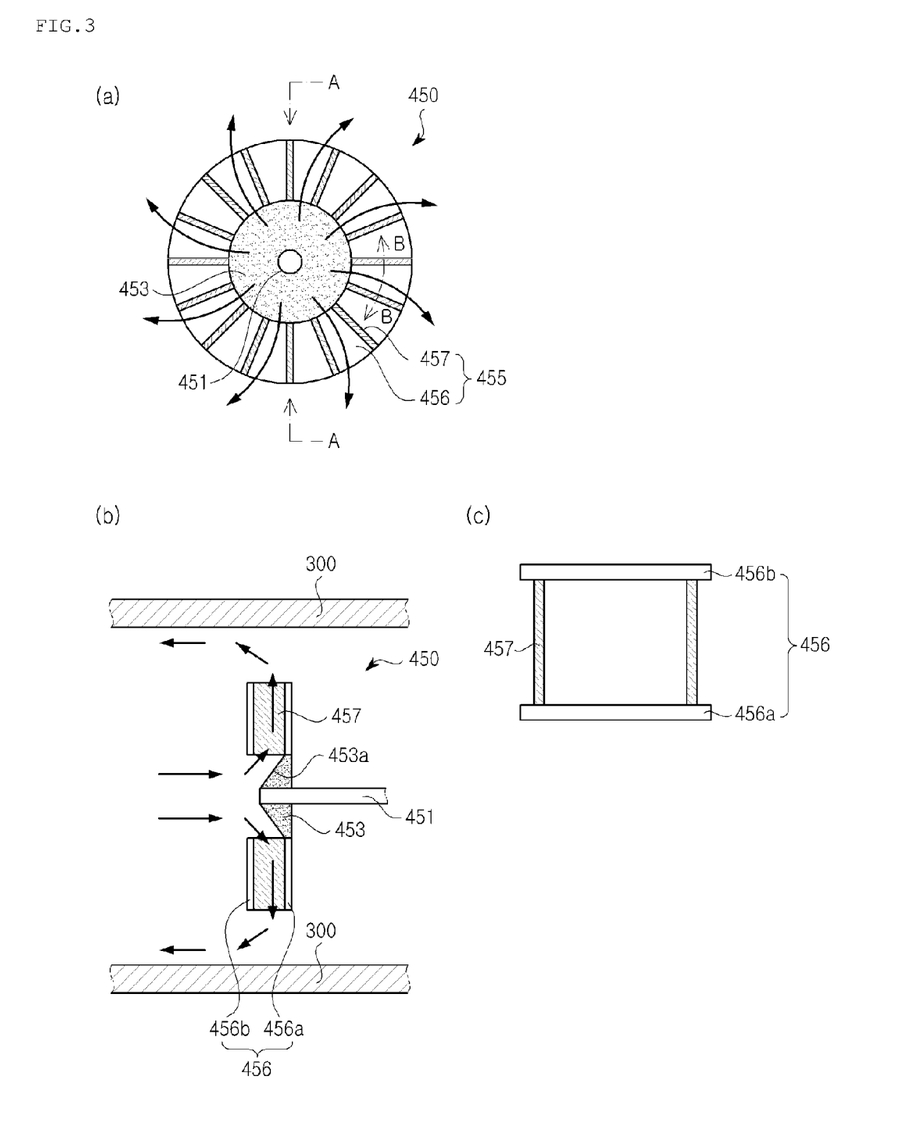
FIG. 3(a) is a front view of an air flow adjusting apparatus according to one embodiment of the present invention.
FIG. 3(b) is a cross sectional view along A-A of FIG. 3(a)
FIG. 3(c) is a cross sectional view along B-B of FIG. 3(a).

FIG. 3(a) is a front view of the air flow adjusting apparatus according to one embodiment of the present invention, FIG. 3(b) is a cross sectional view along A-A of FIG. 3(a), and FIG. 3(c) is a cross sectional view along B-B of FIG. 3(a).

As shown in FIGS. 3(a) to 3(c), the air flow adjusting apparatus 450 according to one embodiment of the present invention may include a driving axis 451, an air flow suction unit 453, and an air flow discharging unit 455.

The driving axis 451 is formed in the center of the air flow adjusting apparatus 450, to thereby rotate the air flow adjusting apparatus 450. The driving axis 451 is connected with a driving apparatus (not shown), and the driving axis 451 is rotated by an operation of the driving apparatus.

The air flow suction unit 453 is provided to suck the air flow inside the reaction chamber 300, and the air flow suction unit 453 is connected with the driving axis 451. The air flow suction unit 453 is provided with an incline surface 453a. The air flow sucked along the incline surface 453a is moving and transferred to the air flow discharging unit 455. The incline surface 453a may be formed in a straight line from one end of the driving axis 451 to the air flow discharging unit 455. The driving axis 451 is connected with the center of the air flow suction unit 453, whereby the air flow suction unit 453 is formed in a cone shape.

The air flow discharging unit 455 discharges the air flow, which is transferred from the air flow suction unit 453, toward an internal wall of the reaction chamber 300. The air flow discharging unit 455 is connected with the air flow suction unit 453. The air flow discharging unit 455 may include an air flow path part 456 and an air flow guide part 457.

The air flow path part 456 is connected with an end of the air flow suction unit 453, that is, the air flow path part 456 serves as a path for the air flow. The air flow path part 456 may include a first air flow path part 456a connected with an end of the air flow suction unit 453, and a second air flow path part 456b provided at a predetermined interval from the first air flow path part 456a.

The first air flow path part 456a is connected with a lower side of the air flow guide part 457, and the second air flow path part 456b is connected with an upper side of the air flow guide part 457. Thus, the air flow moves in the space between the first air flow path part 456a and the second air flow path part 456b. From a front view, each of the first air flow path part 456a and the second air flow path part 456b is formed in a structure of doughnut-shaped plane plate.

The air flow guide part 457 is provided to uniformly discharge the air flow moving to the air flow path part 456 toward the internal wall of the reaction chamber 300. The plurality of air flow guide parts 457 are combined with the air flow path part 456. The air flow guide part 457 is formed in a thin partition structure between the first air flow path part 456a and the second air flow path part 456b so that a path of the air flow is divided into a plurality of sub-paths, to thereby discharge the air flow uniformly. FIG. 3(a) shows the straightly-shaped air flow guide part 457, but not necessarily. For example, from a front view, the air flow guide part 457 may be formed in a curved-shaped structure.

An operation of the air flow adjusting apparatus 450 will be described as follows.

When the driving axis 451 rotates, the air flow inside of the reaction chamber 300 is sucked to the air flow suction unit 453. After the sucked air flow moves along the incline surface 453a of the air flow suction unit 453, the air flow is transferred to the air flow discharging unit 455. Then, while the air flow transferred to the air flow discharging unit 455 moves in the space defined by the first air flow path part 456a, the second air flow path part 456b and the air flow guide part 457, the air flow is uniformly discharged toward the internal wall of the reaction chamber 300, and the air flow discharged toward the internal wall of the reaction chamber 300 moves toward the opposite direction of the door chamber (See '400' of FIG. 2). Thus, the air flow inside the reaction chamber 300 is circulated by the air flow adjusting apparatus 450. A detailed description for the circulation of the air flow will be described later.

Figure 4:
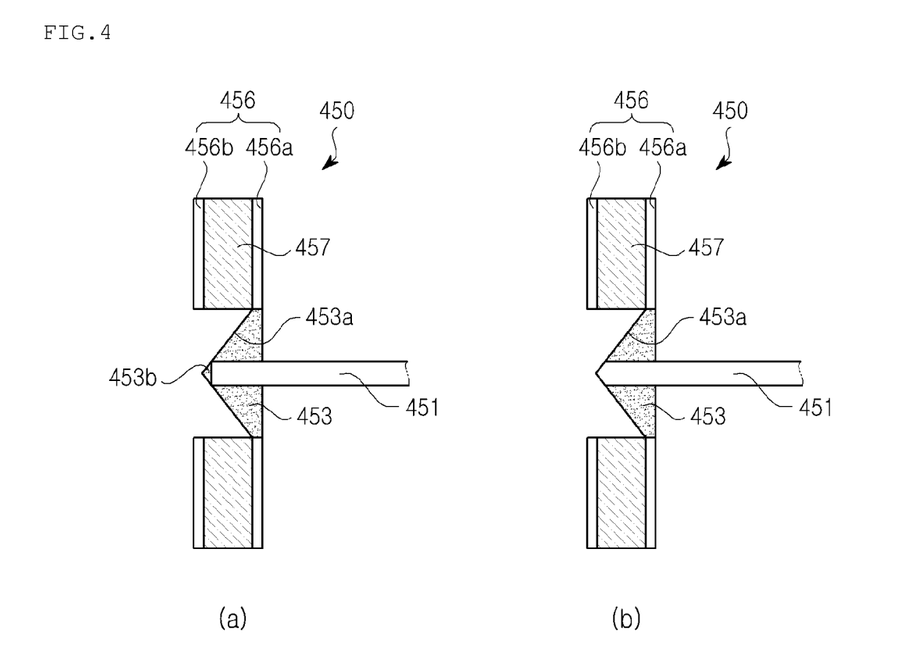
FIGS. 4(a) and 4(b) are lateral views illustrating an air flow adjusting apparatus according to another embodiment of the present invention.

FIGS. 4(a) and 4(b) are lateral views illustrating the air flow adjusting apparatus 450 according to another embodiment of the present invention, which show a structure enabling to minimize problems occurring when the air flow might be stagnant in the center during the suction of air flow. That is, as described in the above embodiment of the present invention, the driving axis 451 formed in the center of the air flow suction unit 453 has a flat end so that a reflection of straight air flow occurs in the end, and thus the sucked air flow collides with the reflected air flow, thereby causing the problem of stagnant air flow. In order to overcome this problem, the structures of FIGS. 4(a) and 4(b) may be preferable.

Except that the air flow suction unit 453 connected with the driving axis 451 has a sharp-pointed end 453b, the air flow adjusting apparatus 450 of FIG. 4(a) is identical to the air flow adjusting apparatus 450 of FIGS. 3(a) to 3(c). As shown in FIG. 4(a), the sharp-pointed end 453b of the air flow suction unit 453 is additionally provided on the end of the driving axis 451, whereby the air flow sucked by the air flow suction unit 453 moves along the incline surface 453a without being stagnant on the sharp-pointed end 453b. The sharp-pointed end 453b may have the same inclination as that of the incline surface 453a.

Except that the driving axis 451 has a sharp-pointed end, the air flow adjusting apparatus 450 of FIG. 4(B) is identical to the air flow adjusting apparatus 450 of FIGS. 3(a) to 3(c). As shown in FIG. 4(B), according as the sharp-pointed end of the driving axis 451 is exposed to the outside, the air flow sucked by the air flow suction unit 453 moves along the incline surface 453a without being stagnant on the sharp-pointed end of the driving axis 451. The sharp-pointed end of the driving axis 451 may have the same inclination as that of the incline surface 453a.

Figure 5:
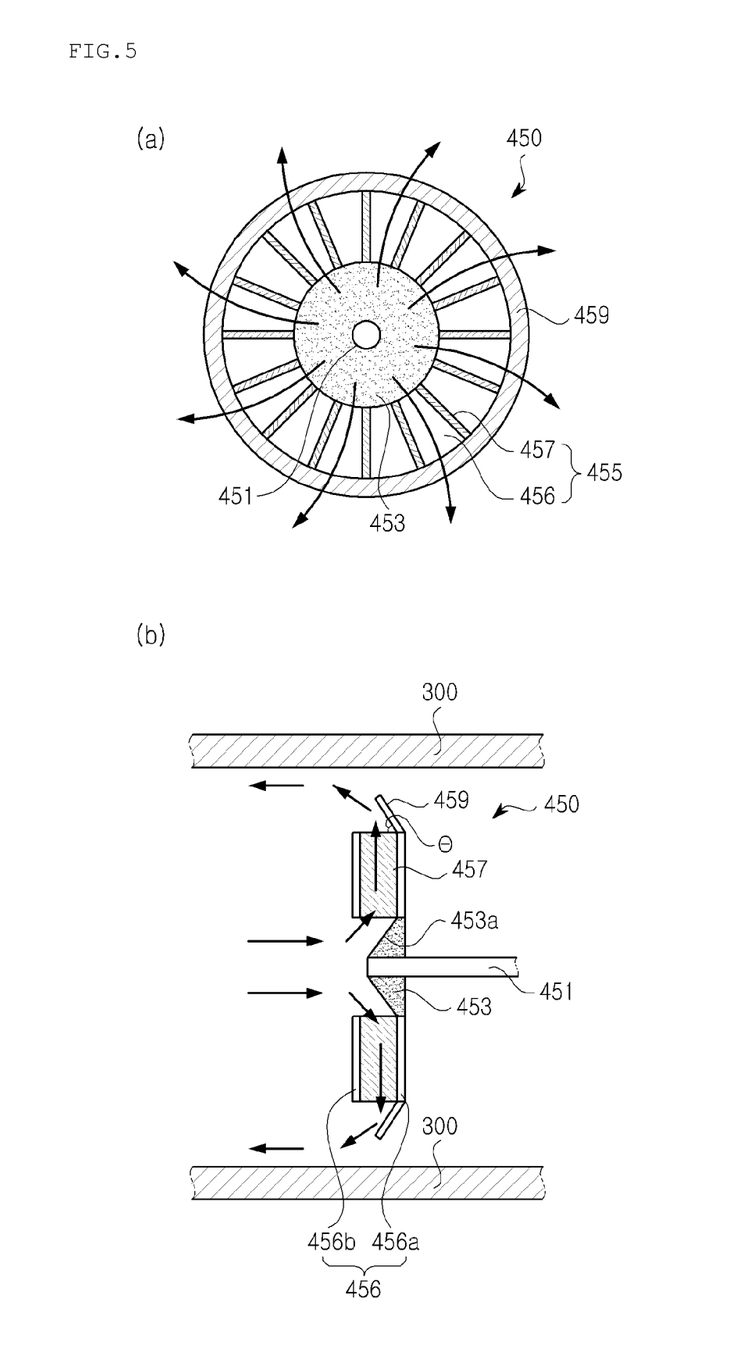
FIGS. 5(a) and 5(b) are respective front and lateral views illustrating an air flow adjusting apparatus according to another embodiment of the present invention.

FIGS. 5(a) and 5(b) are respective front and lateral views illustrating the air flow adjusting apparatus 450 according to another embodiment of the present invention, which show a structure enabling to easily move the air flow to the opposite direction of the door chamber (See '400' of FIG. 2) when the air flow is discharged toward the internal wall of the reaction chamber 300.

Except that an air flow changing unit 459 is additionally provided, the air flow adjusting apparatus 450 of FIGS. 5(a) and 5(b) is identical to the air flow adjusting apparatus 450 of FIGS. 3(a) to 3(c).

As shown in FIGS. 5(a) and 5(b), the air flow changing unit 459 is connected with the air flow discharging unit 455. In more detail, the air flow changing unit 459 is connected with the air flow path part 456, and more particularly, the end of the first air flow path part 456a. The air flow changing unit 459 is connected with the entire end of the first air flow path part 456a formed in the plane structure of doughnut-type plate, whereby the air flow changing unit 459 may be similarly formed in the plane structure of doughnut-type plate, but not necessarily. The air flow changing unit 459 may be formed only in a predetermined portion of the end of the first air flow path part 456a.

The air flow changing unit 459 enables to make the air flow, which is discharged from the air flow discharging unit 455, travel to the opposite direction of the door chamber (See '400' of FIG. 2). In other words, the air flow changing unit 459 guides a traveling direction of the air flow which is discharged toward the internal wall of the reaction chamber 300 toward the opposite direction of the door chamber (See '400' of FIG. 2). Also, the air flow changing unit 459 raises a speed of the air flow traveling toward the front of the air flow adjusting apparatus 450.

To this end, the air flow changing unit 459 extends from the air flow discharging unit 455, and more particularly, the end of the first air flow path part 456a at a predetermined angle θ (0<θ<90), wherein the predetermined angle θ corresponds to an angle in relation to a plane parallel to a wall of the reaction chamber 300. The air flow changing unit 459 extends with the predetermined angle θ toward the front of the air flow adjusting apparatus 450, that is, the opposite direction of the door chamber (See '400' of FIG. 2), whereby the air flow discharged from the air flow discharging unit 455 travels toward the front of the air flow adjusting apparatus 450.

Figure 6:
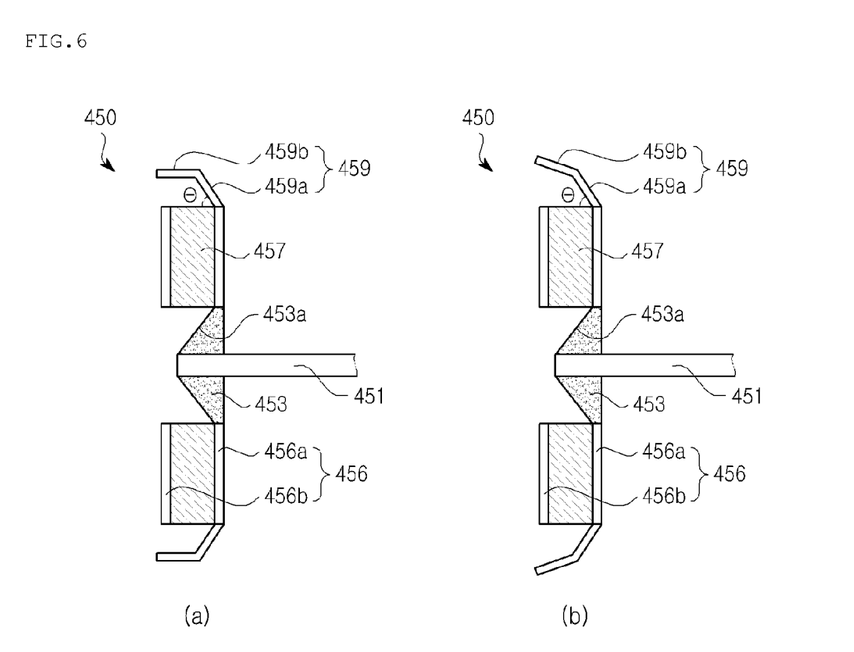
FIGS. 6(a) and 6(b) are lateral views illustrating an air flow adjusting apparatus according to another embodiment of the present invention.

FIGS. 6(a) and 6(b) are lateral views illustrating the air flow adjusting apparatus 450 according to another embodiment of the present invention. Except a structure of the air flow changing unit 459, the air flow adjusting apparatus 450 of FIGS. 6(a) and 6(b) is identical to the air flow adjusting apparatus 450 of FIGS. 5(a) and 5(b).

As shown in FIGS. 6(a) and 6(b), the air flow changing unit 459 may include a first air flow changing unit 459a and a second air flow changing unit 459b. The first air flow changing unit 459a extends from the air flow discharging unit 455, and more particularly, the end of the first air flow path part 456a at a predetermined angle θ (0<θ<90). Also, the second air flow changing unit 459b extends from the end of the first air flow changing unit 459a. The second air flow changing unit 459b may vary in extending angle. That is, as shown in FIG. 6(a), the second air flow changing unit 459b may extend horizontally to the wall of the reaction chamber 300, or as shown in FIG. 6(b), the second air flow changing unit 459b may extend with a predetermined angle in relation to a plane parallel to the wall of the reaction chamber 300, wherein the predetermined angle of the second air flow changing unit 459b may be different from the extending angle θ of the first air flow changing unit 459a.

Figure 7:
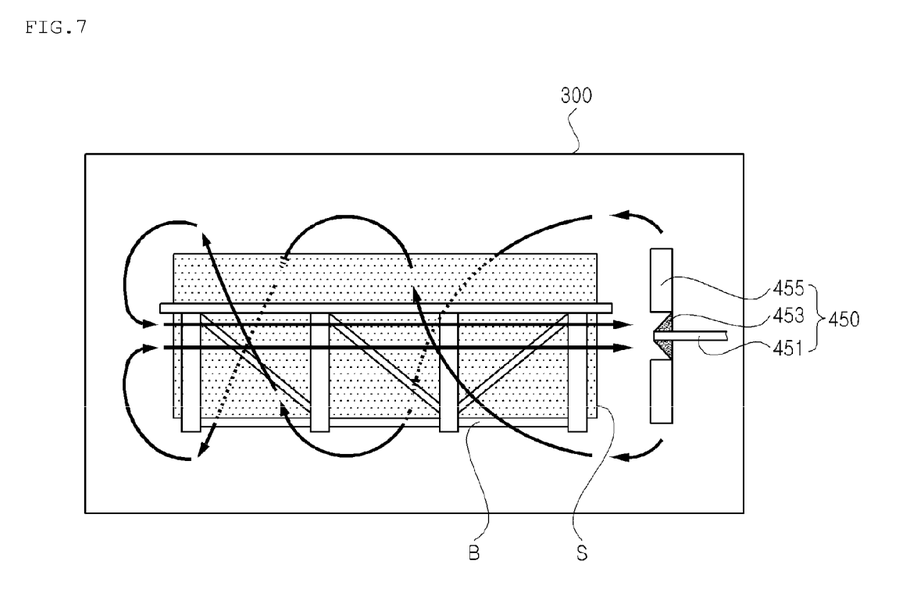
FIG. 7 illustrates a circulation of air flow in accordance with an operation of air flow adjusting apparatus according to one embodiment of the present invention.

FIG. 7 illustrates a circulation of the air flow in accordance with an operation of the air flow adjusting apparatus 450 according to one embodiment of the present invention.

As shown in FIG. 7, the air flow inside the reaction chamber 300 circulates in a swirl structure in accordance with the operation of the air flow adjusting apparatus 450. In more detail, when the air flow adjusting apparatus 450 rotates in a clockwise direction or counterclockwise direction, the air flow discharged from the air flow discharging unit 455 of the air flow adjusting apparatus 450 moves in the swirl structure having the clockwise direction or counterclockwise direction along the periphery of the boat (B) with the substrate (S) placed thereonto toward the rear of the reaction chamber 300. Then, the air flow, which is moved to the rear of the reaction chamber 300, moves toward the air flow adjusting apparatus 450 along the inside of the boat (B) with the substrate (S) placed thereonto by a suction force of the air flow suction unit 453 of the air flow adjusting apparatus 450.

According as the air flow circulates inside the reaction chamber 300, it is possible to maintain a uniform temperature distribution and a uniform concentration of reaction gas, whereby a uniform thermal treatment is performed to the entire substrate (S).

A method of performing the thermal treatment using the thermal treatment system according to one embodiment of the present invention will be described with reference to FIG. 2.

First, the reaction space of the reaction chamber 300 is opened by transferring the door chamber 400 through the use of predetermined transferring device. After the boat (B) with the plurality of substrates (S) placed thereonto is loaded into the reaction space of the reaction chamber 300, the reaction space of the reaction chamber 300 is closed by transferring the door chamber 400 through the use of predetermined transferring device, to thereby complete a preparation of the thermal treatment.

Then, the air inside the reaction chamber 300 is discharged through the gas exhausting unit 800, and then inert gas, for example, nitrogen ($N_2$) gas is supplied to the inside of the reaction chamber 300 through the gas supplying unit 900 (first process).

An oxygen concentration inside the reaction chamber 300 is not more than 1% by repetitively discharging the air and supplying the inert gas.

Then, while a temperature inside the reaction chamber 300 is gradually raised by operation of the heater module 200, the inert gas and first reaction gas such as $H_2Se$ gas are supplied to the inside of the reaction chamber 300 through the gas supplying unit 900, and the inside of the reaction chamber 300 is maintained at a uniform pressure, for example, 500~750 Torr (second process).

When supplying the first reaction gas and the inert gas, the air flow adjusting apparatus of FIGS. 3 to 7 is operated so as to circulate the air flow inside the reaction space of the reaction chamber 300, to thereby maintain the uniform temperature distribution and uniform concentration of reaction gas in the entire reaction space. An operation of the air flow adjusting apparatus 450 may be continuously performed until the following third, fourth, fifth, sixth, seventh, eighth and ninth processes are completed.

Next, after the inside of the reaction chamber 300 is raised to a first temperature, for example, 400~500° C., the first temperature is maintained, and a first reaction is performed to a precursor layer on the substrate (S) (third process).

After discharging the first reaction gas, which remains after the first reaction, through the gas exhausting unit 800, second reaction gas such as $H_2S$ gas is supplied to the inside of the reaction chamber 300 through the gas supplying unit 900 (fourth process).

Then, after the inside of the reaction chamber 300 is raised to a second temperature, for example, 500~600° C., the second temperature is maintained, and a second reaction is performed to the precursor layer on the substrate (S) (fifth process).

A first cooling process is carried out so as to lower the temperature inside the reaction chamber 300 for a predetermined time period (sixth process).

The first cooling process may be carried out by operating the aforementioned external cooling system 700. That is, the second heat exchange apparatus 720 and the second circulation apparatus 730 included in the external cooling system 700 are operated so that the cooled inert gas is circulated and supplied to the buffer space 150, to thereby cool the external wall of the reaction chamber 300.

However, it is not limited to the above method. Instead of the first cooling process, it is possible to use the natural cooling method.

After discharging the second reaction gas, which remains in the reaction chamber 300, through the gas exhausting unit 800, the inert gas is supplied to the inside of the reaction chamber 300 through the gas supplying unit 900 (seventh process).

While the above processes of discharging the remaining reaction gas and supplying the inert gas are repetitively carried out, the cooling process is continuously performed through the use of external cooling system 700.

Then, a second cooling process for the inside of the reaction chamber 300 is carried out by operating the internal cooling system 600 together with the external cooling system 700 (eighth process).

According to one embodiment of the present invention, after completing the reaction on the substrate (S), the internal cooling system 600 and the external cooling system 700 are not operated at the same time. Instead, after completing the reaction on the substrate (S), the first cooling process is carried out at a relatively low speed, and then the high-temperature second reaction gas which remains in the reaction chamber 300 is discharged. Thereafter, the second cooling process of rapid cooling is carried out through the use of internal cooling system 600 and external cooling system 700.

As described above, the first cooling process is firstly carried out at a relatively low speed, that is, first cooling speed, and then the second cooling process is secondly carried out at a relatively high speed, that is, second cooling speed, so that it is possible to prevent the substrate (S) from being damaged by a rapid temperature change.

An operation of the internal cooling system 600 for the second cooling process of rapid cooling will be described in detail. First, after the shutoff valves 640a and 640b of the internal cooling system 600 are opened, the first heat exchange apparatus 620 and the first circulation apparatus 630 are operated so that the cooled inert gas is circulated and supplied to the inside of the reaction chamber 300, to thereby cool the inside of the reaction chamber 300.

For the second cooling process of rapid cooling, it is unnecessary to operate the internal cooling system 600 and the external cooling system 700 at the same time. For example, only the internal cooling system 600 is operated, and the external cooling system 700 is not operated.

Then, the gas inside the reaction chamber 300 is discharged through the gas exhausting unit 800, and the inert gas is supplied to the inside of the reaction chamber 300 through the gas supplying unit 900. These processes are repetitively carried out (ninth process).

After completing the above thermal treatment, the door chamber 400 is transferred through the use of predetermined transferring device, whereby the reaction space of the reaction chamber 300 is opened, and the boat (B) with the plurality of substrates (S) placed thereonto is unloaded from the reaction space of the reaction chamber 300.

For the above description, the first reaction using the first reaction gas $H_2Se$ on the substrate (S) is carried out, and the second reaction using the second reaction gas $H_2S$ is carried out. However, it is not limited to the above method. It is possible to carry out one reaction using one reaction gas.

Figure 8:
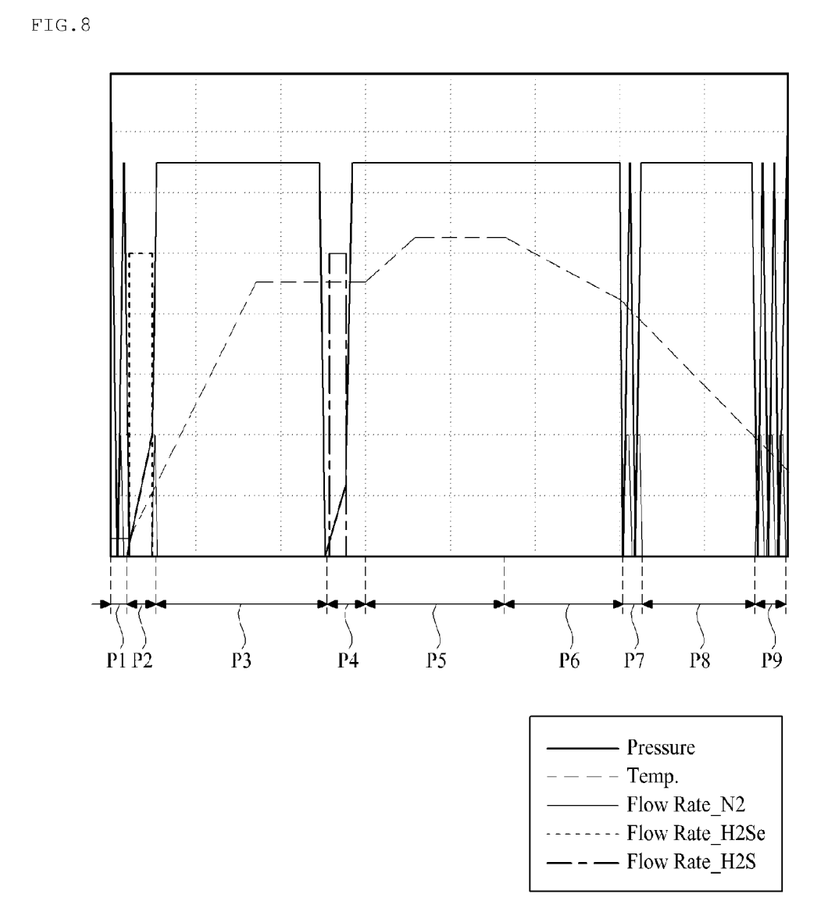
FIG. 8 is a progress chart for a thermal treatment according to one embodiment of the present invention.

FIG. 8 is a progress chart for the thermal treatment according to one embodiment of the present invention, which is a chart showing pressure, temperature, flow of inert gas ($N_2$), flow of first reaction gas ($H_2Se$), and flow of second reaction gas ($H_2S$) inside the reaction chamber 300 in accordance with the method of performing the thermal treatment using the above thermal treatment system.

Hereinafter, the progress chart for the thermal treatment shown in FIG. 8 will be described with reference to FIG. 2.

The first process (P1) is to minimize the oxygen concentration inside the reaction chamber 300 by replacing the inside of the reaction chamber 300 with the inert gas. For the first process (P1), the process for discharging the air inside the reaction chamber 300 and the process for supplying the inert gas ($N_2$) to the inside of the reaction chamber 300 are repetitively carried out so that a temperature inside the reaction chamber 300 is maintained at the room temperature, and a pressure inside the reaction chamber 300 is changed.

The second process (P2) is to start the first reaction on the substrate (S) by raising the temperature inside the reaction chamber 300 and supplying the first reaction gas to the inside of the reaction chamber 300. For the second process (P2), the temperature inside the reaction chamber 300 is raised gradually, and the first reaction gas ($H_2Se$) and inert gas are supplied to the inside of the reaction chamber 300. After completing the gas supply, the inside the reaction chamber 300 is maintained at a uniform pressure, for example, 500~750 Torr.

The third process (P3) is to complete the first reaction on the substrate (S) while the temperature inside the reaction chamber 300 is maintained at the first temperature. For the third process (P3), the temperature inside the reaction chamber 300 is raised to the first temperature, for example 400~500° C., and is then maintained. In this case, the inside the reaction chamber 300 is maintained at the uniform pressure.

The fourth process (P4) is to start the second reaction on the substrate (S) by replacing the inside of the reaction chamber 300 with the second reaction gas. For the fourth process (P4), after discharging the reaction gas which remains after the first reaction, the second reaction gas ($H_2S$) is supplied to the inside of the reaction chamber 300. After completing the gas supply, the inside of the reaction chamber 300 is maintained at the uniform pressure. In this case, the temperature inside the reaction chamber 300 is maintained at the first temperature, but not necessarily. While supplying the second reaction gas ($H_2S$), the temperature inside the reaction chamber 300 may be raised.

The fifth process (P5) is to complete the second reaction on the substrate (S) by raising the temperature inside the reaction chamber 300 to the second temperature. For the fifth process (P5), the temperature inside the reaction chamber 300 is raised to the second temperature, for example, 500~600° C., and the second temperature is maintained. In this case, the inside the reaction chamber 300 is maintained at the uniform pressure.

The sixth process (P6) is the first cooling process for the reaction chamber 300 after completion of the reaction on the substrate (S). For the sixth process (P6), the external cooling system 700 is operated so that the temperature inside the reaction chamber 300 is gradually lowered. Thus, the inside the reaction chamber 300 is maintained at the uniform pressure.

For the seventh process (P7), the process of discharging the reaction gas inside the reaction chamber 300 and the process of supplying the inert gas ($N_2$) to the inside of the reaction chamber 300 are repetitively carried out. Thus, the pressure inside the reaction chamber 300 is changed. The external cooling system 700 is also operated for the seventh process (P7).

The eighth process (P8) is the second cooling process of rapid cooling for the reaction chamber 300. That is, the second cooling speed of the eighth process (P8) is more rapid than the first cooling speed of the sixth process (P6). For the eighth process (P8), both the internal cooling system 600 and the external cooling system 700 are operated together so as to rapidly cool the reaction chamber 300. In this case, the inside of the reaction chamber 300 is maintained at the uniform pressure.

The ninth process (P9) is the process for completing the thermal treatment, that is, preparing the unloading of the substrate (S). For the ninth process (P9), the process of discharging the reaction gas inside the reaction chamber 300 and the process of supplying the inert gas ($N_2$) to the inside of the reaction chamber 300 are repetitively carried out. Thus, the pressure inside the reaction chamber 300 is changed.

For the above description, the thermal treatment system and the method of performing the thermal treatment for forming a light-absorbing layer of CIGS solar cell have been explained. However, the thermal treatment system and the method of performing the thermal treatment according to the present invention are not limited to the method for forming the light-absorbing layer of CIGS solar cell.

FIGS. 9a to 9e are cross sectional views illustrating a method for manufacturing a CIGS solar cell according to one embodiment of the present invention.

Figure 9A:
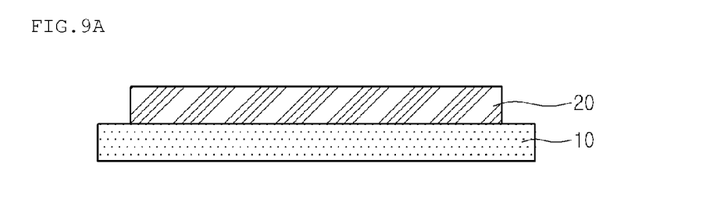
FIGS. 9(a) to 9(e) are cross sectional views illustrating a method of manufacturing a CIGS solar cell according to one embodiment of the present invention.

First, as shown in FIG. 9a, a rear electrode 20 is formed on a substrate 10.

The substrate 10 may be formed of glass or transparent plastic.

The rear electrode 200 may be formed of a conductive material such as molybdenum (Mo) by sputtering, MOCVD (Metal Organic Chemical Vapor Deposition) or printing.

Figure 9B:
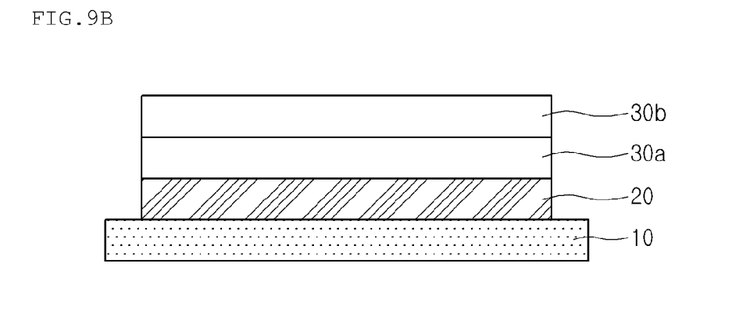

Then, as shown in FIG. 9b, precursor layers 30a and 30b are formed on the rear electrode 20.

A process of forming the precursor layers 30a and 30b may include steps for forming the first precursor layer 30a on the rear electrode 20, and forming the second precursor layer 30b on the first precursor layer 30a.

The first precursor layer 30a may be formed of a conductive material including copper-gallium (CuGa) by sputtering, MOCVD or evaporation.

The second precursor layer 30b may be formed of a conductive material including indium (In) by sputtering, MOCVD or evaporation.

Figure 9C:
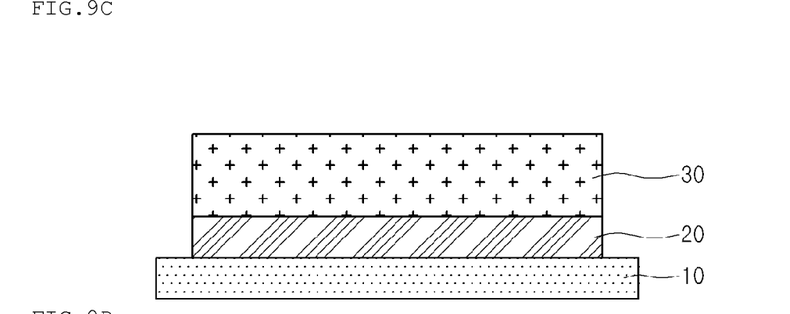

As shown in FIG. 9c, a thermal treatment for the precursor layers 30a and 30b is performed to form a light-absorbing layer 30.

A process of forming the light-absorbing layer 30 may be a process for accelerating a chemical reaction between elements by a thermal treatment under the atmosphere of $H_2SE$ gas or mixture gas of $H_2SE$ and $H_2S$. The thermal treatment may be performed by the aforementioned thermal treatment system, and a detailed description for the thermal treatment system will be omitted.

Figure 9D:
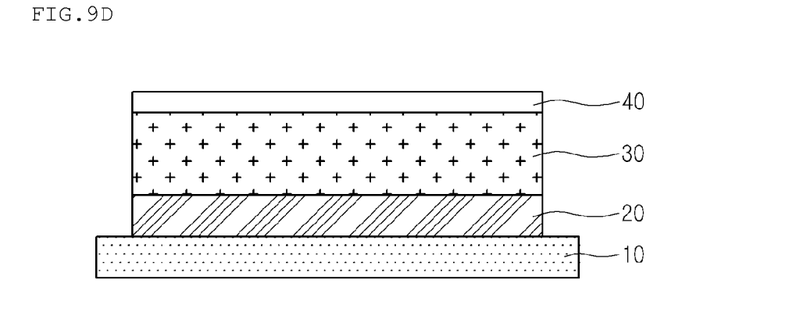

As shown in FIG. 9d, a buffer layer 40 is formed on the light-absorbing layer 30.

The buffer layer 40 may be formed of a material such as CdS, InS or ZnS by CBD (Chemical Bath Deposition), MOCVD, sputtering or ALD (Atomic Layer Deposition).

Figure 9E:
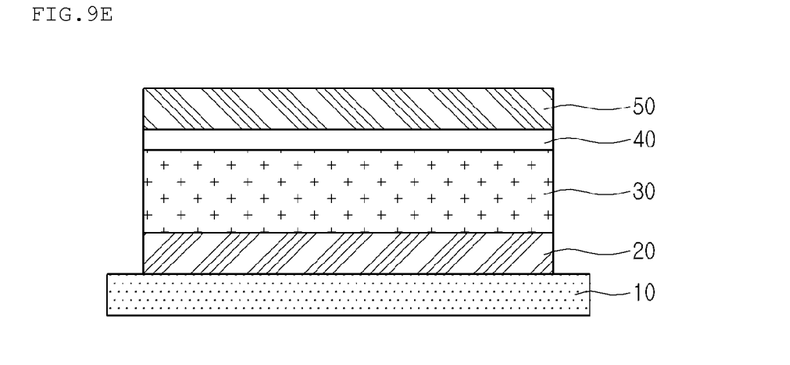

As shown in FIG. 9e, a front electrode 50 is formed on the buffer layer 40.

The front electrode 50 may be formed of a transparent conductive material such as ZnO, ZnO:B, ZnO:Al, SnO$_2$, SnO$_2$:F or ITO (Indium Tin Oxide) by sputtering or MOCVD.

What is claimed is:

1. A thermal treatment system comprising:
   a reaction chamber with a reaction space;
   an external chamber surrounding the reaction chamber, the external chamber provided at a predetermined interval from the reaction chamber;
   a door chamber provided to open or close the reaction space of the reaction chamber;
   a heater module including a first heater module between the reaction chamber and the external chamber, and a second heater module in the front of the door chamber; and
   an air flow adjusting apparatus for circulation of an flow inside the reaction space of the reaction chamber, wherein the air flow adjusting apparatus includes a driving axis, an air flow suction unit connected with the driving axis, and an air flow discharging unit connected with the air flow suction unit, wherein air flow inside the reaction space is sucked to the air flow suction unit by an operation of the driving axis, and is then discharged through the air flow discharging unit so as to circulate air flow inside the reaction space, wherein the air flow adjusting apparatus is in the front of the second heater module.

2. The thermal treatment system according to claim 1, wherein the air flow suction unit is provided with an incline surface extending from one end of the driving axis to the air flow discharging unit, and wherein the air flow discharging unit includes a first air flow path part connected with the air flow suction unit, a second air flow path part provided at a predetermined interval from the first air flow path part, and a plurality of air flow guide parts formed in a partition structure and provided between the first air flow path part and the second air flow path part.

3. The thermal treatment system according to claim 1, wherein the air flow suction unit additionally includes a sharp-pointed end on an end of the driving axis.

4. The thermal treatment system according to claim 1, wherein the driving axis has a sharp-pointed end and the sharp-pointed end of the driving axis is exposed to the outside of the air flow suction unit.

5. The thermal treatment system according to claim 1, wherein an air flow changing unit is additionally provided in the air flow discharging unit so as to guide the air flow to the front of the air flow adjusting apparatus.

6. The thermal treatment system according to claim 5, wherein the air flow changing unit extends to the front of the air flow adjusting apparatus at a predetermined angle θ (0<θ<90), wherein the predetermined angle θ corresponds to an angle in relation to a plane parallel to a wall of the reaction chamber.

7. The thermal treatment system according to claim 5, wherein the air flow changing unit includes a first air flow changing unit extending to the front of the air flow adjusting apparatus at a predetermined angle θ (0<θ<90) in relation to a plane parallel to a wall of the reaction chamber, and a second air flow changing unit extending from the first air flow changing unit, wherein an extending angle of the second air flow changing unit is different from an extending angle of the first air flow changing unit.

8. A thermal treatment system comprising:
   a reaction chamber with a reaction space;
   an external chamber surrounding the reaction chamber, the external chamber provided at a predetermined interval from the reaction chamber;
   a door chamber provided to open or close the reaction space of the reaction chamber;
   an air flow adjusting apparatus for circulation of an flow inside the reaction space of the reaction chamber, wherein the air flow adjusting apparatus includes a driving axis, an air flow suction unit connected with the driving axis, and an air flow discharging unit connected with the air flow suction unit, wherein air flow inside the reaction space is sucked to the air flow suction unit by an operation of the driving axis, and is then discharged through the air flow discharging unit so as to circulate air flow inside the reaction space;
   a sealing member for sealing a space between the reaction chamber and the surrounding atmosphere;
   an internal cooling system for cooling the inside of the reaction chamber, the internal cooling system being in communication with the reaction space; and
   an external cooling system for cooling an external wall of the reaction chamber, the external cooling system being in communication with a buffer space between the reaction chamber and the external chamber, wherein the internal cooling system is communicated with the reaction space of the reaction chamber by a through hole provided in the sealing member.

* * * * *